March 31, 1970 B. E. OLSSON 3,504,328

CIRCUIT BOARD EYELET

Original Filed April 19, 1967 2 Sheets-Sheet 1

INVENTOR

BILLY E. OLSSON

BY Whittemore, Hulbert + Belknap

ATTORNEYS

INVENTOR
BILLY E. OLSSON

BY Whittemore, Hulbert & Belknap
ATTORNEYS 3,504,328
CIRCUIT BOARD EYELET

Billy E. Olsson, New Cumberland, Pa., assignor to Berg Electronics, Inc., New Cumberland, Pa., a corporation of Pennsylvania
Continuation of application Ser. No. 631,992, Apr. 19, 1967. This application Jan. 3, 1968, Ser. No. 712,317
The portion of the term of the patent subsequent to Feb. 6, 1985, has been disclaimed
Int. Cl. H05k *1/10;* H01r *9/06, 9/16*
U.S. Cl. 339—17 19 Claims

ABSTRACT OF THE DISCLOSURE

An improved miniature circuit board eyelet for holding a lead wire and for establishing a circuit board through connection. The eyelet includes a number of inwardly converging fingers which grip and hold the wire within the thickness of the circuit board. These fingers are connected to a circumferential flange so that the flange aids in stiffening the fingers while also serving as a lead-in for guiding insertion of lead wires into the body of the eyelet. When the eyelet is solder dipped a reliable electrical connection is established between printed circuit paths on both sides of the circuit board and the lead wire. Stress relief pillars reduce cracking at the solder joint between the eyelet and the printed circuit path on the top of the circuit board.

This application is a continuation of Olsson Ser. No. 631,992, for "Circuit Board Eyelet," filed Apr. 19, 1967.

BACKGROUND OF THE INVENTION

The invention relates to a miniature circuit board eyelet used for securing a lead wire to the circuit board prior to a soldering operation, such as dip soldering. The eyelet is also useful in establishing a crack-free solder connection with printed circuitry on the top side of the circuit board in order to make a reliable electrical connection with a lead wire inserted in the eyelet or the printed circuitry on the bottom side of the circuit board.

In the art it is conventional to form circuit board eyelets by drawing so that the eyelet has a flat head. The drawn eyelet is inserted in a circuit board hole so that the head is flush with one side of the circuit board. The other end of the eyelet is then flattened to extend flush against the other side of the circuit board. The lead wire is inserted in the eyelet and the circuit board is solder dipped in order to connect the lead wire to the printed circuitry on the board.

The conventional eyelet is unsatisfactory because the solder joints formed between the flat heads of the eyelet and the circuit board are thin and weak. These joints are liable to crack during cooling, and do not make a reliable electrical connection between the lead wire and the printed circuit on the circuit board. Cracking usually occurs at the joint between the top eyelet flange and the printed circuitry on the top of the circuit board. This type of cracking occurs usually during cooling immediately following solder dipping and results from the difference in the thermal expansion coefficients of the organic circuit board and the metal eyelet. The cracking phenomenon is discussed more fully in Hodges, "Eyelet Failure in Etched Wiring," pp. 109–114, I.R.E. Transactions, Production Techniques, April 1957. The solder connection in conventional eyelets with the circuitry on the top of the circuit board is also found to crack when the soldered circuit board is exposed to thermal shock.

Also, the conventional eyelet does not provide any means for gripping and holding the lead wire once it is inserted in the body of the eyelet. The leads are free to fall out of the eyelet or to change position therein and project downwardly below the surface of the circuit board. In mass production wiring of circuit boards using conventional eyelets it is usual to provide an operator whose sole responsibility is to make sure all the lead wires are in their proper eyelets prior to solder dipping of the board. Additional labor is required to check to be sure that the leads do not extend below the circuit board. In a number of applications there is very slight clearance beneath the circuit board, and short circuiting would result if a lead wire projected any appreciable distance from the bottom of the circuit board.

SUMMARY OF THE INVENTION

The invention is a sheet metal eyelet for attachment to a circuit board for holding the lead wire or lead wires to the circuit board during a soldering operation and for establishing a reliable electrical connection with the printed circuitry on the board. The eyelet includes flanges on each end thereof which project away from the surface of the circuit board at an angle, preferably 45° from the circuit board, to provide an annular solder V which is filled with molten solder during solder dipping. When the molten solder in these Vs cools, a reliable joint is formed between the eyelet and the circuit board and the undesirable cracks formed in the solder joint between the conventional type eyelet and the circuit board are eliminated. During cooling and contraction of the circuit board and eyelet, stress relief pillars in the eyelet are deformed slightly to collapse the eyelet longitudinally and permit the flanges to follow the circuit board. In this way differential movement between the flange and the circuit board due to the greater contraction of the board is eliminated and cracking is prevented.

The eyelet is provided with a number of inwardly extending gripping fingers which form extensions of the flange on one end thereof so that the free end of the fingers are positioned adjacent one another at the other end of the eyelet. These fingers are resilient so that when a lead is inserted into the eyelet they are bent apart and firmly grip the lead thereby holding it in place for solder dipping. One of the eyelet flanges provides a lead-in for the wire to be inserted in the eyelet. The eyelets referred to in this application are very small so that it is difficult to insert the wire in the eyelet either by hand or by means of an automatic inserting machine. By providing the lead-in flange, this problem is reduced since the flange extends away from the body and provides a larger target for the lead wire. The eyelet is compact and extends only a small distance to either side of the circuit board. Because the wire grip fingers are located within the thickness of the circuit board the lead wire held by the eyelet need not project appreciably below the lower surface of the circuit board, thus enabling the circuit board to be positioned closer to other circuit elements than if conventional circuit board eyelets were used.

Accordingly, an object of the invention is to provide a new and improved circuit board eyelet having the advantages referred to above.

Other objects and features of the invention will become apparent as the description proceeds, especially when taken in conjunction with the accompanying drawings illustrating a preferred embodiment of the invention, wherein.

Figures 1, 4:
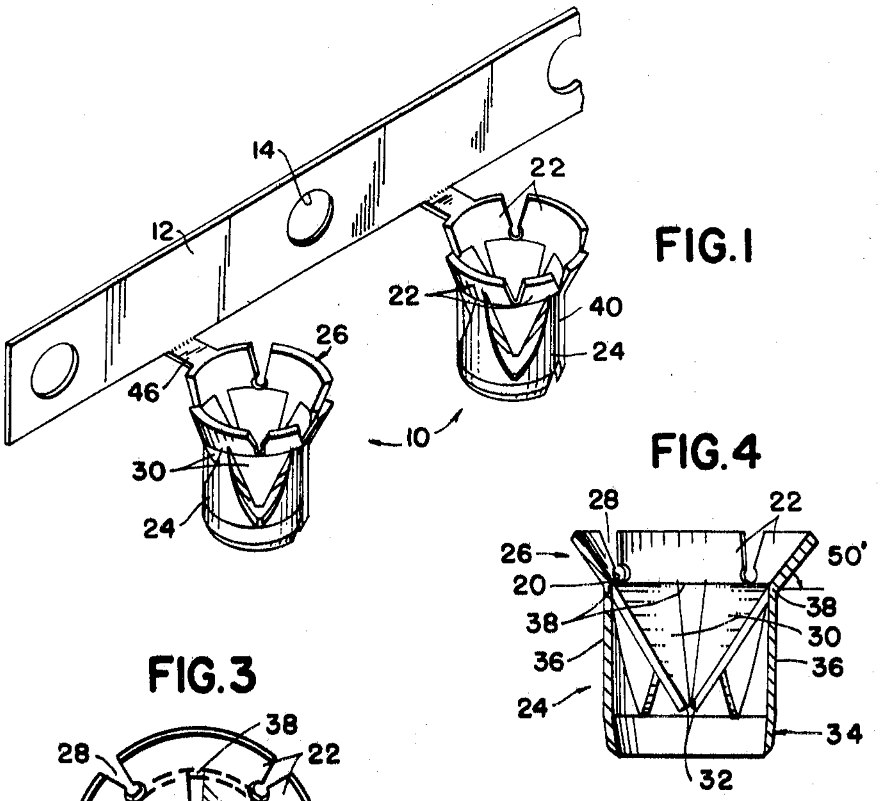
FIGURE 1 is a perspective view of circuit board eyelets according to the invention, attached to a carrier strip.
FIGURE 4 is a sectional view taken along line 4—4 of FIGURE 3.
Figure 3:
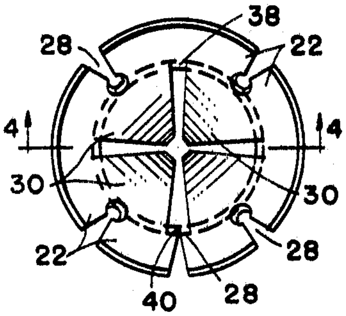
FIGURE 3 is a top view of FIGURE 2.
Figures 6, 7, 8, 9:
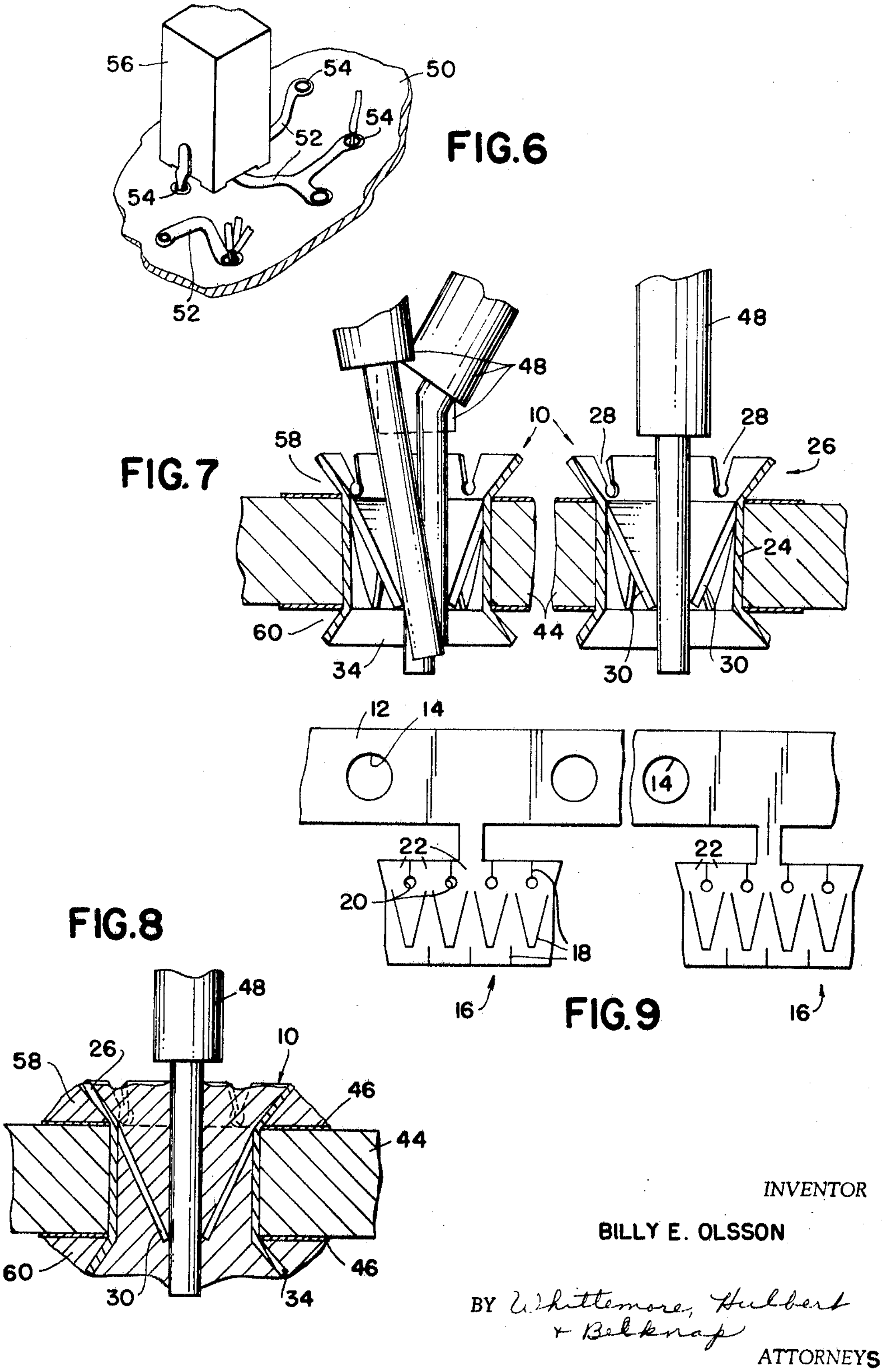
FIGURE 6 is a perspective view of a circuit board showing use of the eyelet.
FIGURE 7 is a sectional view of two eyelets showing lead wires inserted therein prior to solder dipping.
FIGURE 8 is a sectional view showing an eyelet after solder dipping.
FIGURE 9 is a view of a strip of metal from which the eyelets are formed.

A circuit board eyelet 10 according to the invention is preferably formed from sheet metal stock shown in FIGURE 9 by means of a stamping die. The sheet metal stock, which may be steel, brass, Phosphor bronze, beryllium copper, or other suitable metal, is press stamped to provide a carrier strip 12 having pilot holes 14 regularly spaced therealong and eyelet blanks 16 secured to the strip at one side thereof. The blanks 16 are slit as indicated at 18 and punched at 20. In a further die operation the blanks 16 are rolled to form eyelets 10 as illustrated in FIGURE 1. The rolled eyelets are offset from strip 12 to facilitate attachment of the eyelet to the circuit board. During rolling of the eyelet blank 16 sections 22 of the blanks are bent away from the cylindrical body 24 of the eyelet to provide an outwardly extending circumferential flange 26. The punched holes 20 are located at the bottom of flange 26 adjacent the top of the body 24 of the eyelet. Slits 18 connecting holes 20 to the top of the blank 16 are spread apart during flaring of the flange to provide notches 28 which extend from the outer edge of the flange to the top of the body portion 24.

Wire grip fingers 30 are formed from the side walls of the body portion 24 and are connected to the flange 26 at the top of the body portion. The fingers are triangular in shape and extend around the circumference of the body and into the center of the eyelet in converging relation so that the free ends 32 thereof are grouped together adjacent the lower end of the body 24. The lower flange portion 34 of the eyelet is rolled to form a slightly tapered lead-in to facilitate insertion of the eyelet into a circuit board hole.

As indicated in FIGURE 4, the flange 26 is bent to an angle of about 50° relative to a plane perpendicular to the axis of the eyelet. The fingers 30 form extensions of the flange 26 and extend therefrom into the interior of the eyelet. The intersection of the flange 26 and fingers 30 with a plane passing through the axis of the cylindrical body portion 24 is essentially linear. There may be a slight deviation from this linearity due to the fact that the fingers 30 are planar while the flange 26 is curved and has the shape of the side of a truncated cone.

Figure 2:
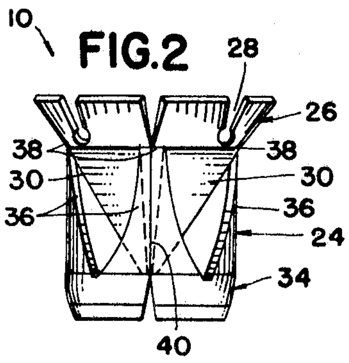
FIGURE 2 is a side view of one of the eyelets shown in FIGURE 1.

As illustrated best in FIGURES 2 and 4, the flange 26 and fingers 30 are connected to pillar portions 36 of the body 24 at 38. Each notch 28 is located in flange 26 at the middle of the circumferential extent of one of the fingers. During rolling of the eyelet blank 16 to form the eyelet 10 the opposite edges of the body portion are brought together at seam 40.

Figure 5:
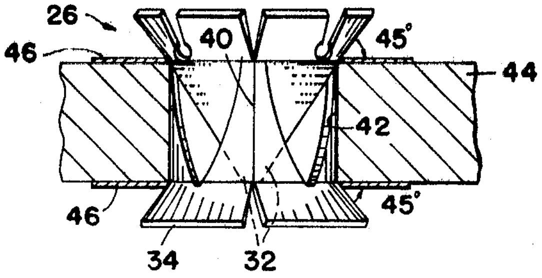
FIGURE 5 is a sectional view through a circuit board showing an eyelet secured thereto prior to insertion of the lead wire and solder dipping.

The eyelet 10 may be severed from the strip 12 at 46 and inserted into a hole 42 in circuit board 44. The eyelet is then positioned between staking tools having conical heads which upon closing stake the eyelet to the circuit board as shown in FIGURE 5. The segmented lower flange portion 34 is flared away from the cylindrical body portion so that it makes an angle of approximately 45° with the surface of the circuit board. The lower staking head which performs this operation is relieved so that it does not deform the free ends 32 of the wire grip fingers. The upper staking head has a 45° side chamfer so that during staking of the eyelet to the circuit board the flange 26 is bent down toward the surface of the circuit board 5° from an angle of 50° to an angle of 45°. This bending of the flange accomplishes two purposes. First, it brings the fingers closer together and may bring the ends 32 into abutment and cause a slight tensing of the fingers 30. This adds to the spring resilience of the fingers so that they securely grip a lead wire when it is inserted into the eyelet. Secondly, the bending of the flange 26 assures proper positioning of the eyelet fingers despite the fact that the circuit board hole 42 may be somewhat larger in diameter than the outer diameter of the body portion 24 of the eyelet. In this case the staking heads will expand the eyelet at seam 40 to snugly fit the oversize hole and the bending of the flange 26 to a 45° angle relative to the surface of the board 44 will again position the ends of the fingers 30 together.

When the eyelet has been attached to the circuit board both the upper and lower flanges make an angle of approximately 45° with the adjacent circuit board surface. The triangular wire grip fingers 30 extend into the eyelet in converging pyramidal relation and substantially close the interior of the eyelet. As shown in FIGURE 5, both sides of the circuit board may be provided with printed circuit paths 46 adjacent the hole 42 so that after solder dipping a reliable electrical connection is formed between the eyelet and the circuit paths.

After the eyelet has been staked to the circuit board, the exposed ends of lead wires 48 may be inserted into the eyelet either manually or by means of an automatic insertion machine. Because of the small size of the eyelets it is often difficult to insert a lead wire exactly into the circuit board hole. The upper flange 26 serves as a funnel-shaped lead-in for guiding the wire into the eyelet, thereby increasing the target area for insertion. The notches 28 are small in comparison to the diameter of the wire inserted into the eyelet so that there is little likelihood of the end of the wire hanging up on one of the notches during insertion. As the wire is pushed between the ends of the wire grip fingers 30, the fingers are forced outwardly toward the body portion 24 of the eyelet as illustrated in FIGURE 7. Since the fingers are connected to the flange 26, the outward flexing of the fingers tends to pivot the flange and fingers about the upper edge of the circuit board hole so that the flat fingers 30 and the rounded flange 26 cooperate to form a spring system urging the fingers into intimate engagement with the end of the lead wire 48. The spring system is secured to the body portion 24 of the eyelet by joints 38. Due to the flexing of the spring system upon insertion of the lead wire, the flange 26 may make an angle with the circuit board slightly greater than the 45° angle of the flange relative to the circuit board shown in FIGURE 5.

During insertion of a lead wire into the eyelet the essentially flat fingers 30 may be bent slightly along their length to increase the gripping force for holding the lead wire in the eyelet. Insertion of a lead wire into the eyelet may bend the fingers 30 relative to flange 26 so as to form a slight acute angle with an extension of the flange 26 as opposed to the orientation of the fingers and flange in the eyelet shown in FIGURE 5 prior to insertion of the lead wire.

As illustrated in FIGURE 7, one or more lead wires may be inserted and securely held in eyelets according to the invention. The cooperation of the fingers 30 and flange 26 provide a strong spring force urging the fingers into engagement with the lead wires so as to securely grip the same and hold them in the inserted position. Thus it will be seen that an eyelet according to the invention prevents lead wires from falling out of the eyelet or from slipping through the eyelet and extending below the lower surface of the circuit board 46. The ability of the circuit board eyelet 10 to securely grip and hold lead wires is an important advantage over conventional eyelets since it enables manufacturers using the eyelets to eliminate checking of the eyelet prior to solder dipping to be sure that the leads are properly positioned therein. Once the lead wires have been inserted in the eyelets the fingers secure the same in that position so that the lead is securely held as inserted during the soldering step.

After lead wires have been inserted in the eyelets as in FIGURE 7, the circuit board is solder dipped by exposing the bottom surface thereof to a pool or wave of molten solder. The molten solder is drawn up into the body of the eyelet by capillary action and flows through the notches 28 into the solder V 58 formed between the flange 26 and the upper surface of the circuit board. Solder also flows directly from the solder bath into the V 60 between the lower flange 34 and the lower surface of the circuit board. FIGURE 8 is a sectional view showing an eyelet after it has been solder dipped. The substantial mass of solder drawn into the solder V's between the circuit board surfaces and the eyelet flanges aids in preventing the hairline cracks common in ordinary eyelet connections with a circuit board where the head of the conventional eyelet is substantially flush with the surface of the circuit board. Thus by providing 45° flanges a more reliable solder connection is formed between the eyelet and the printed circuitry 46 on the circuit board.

The formation of most hairline cracks in conventional circuit board eyelet solder connections occurs during the cooling of the circuit board and eyelet after solder dipping. When the circuit board is dip soldered and comes into contact with the hot molten solder, it is heated to a high temperature. The coefficient of thermal expansion of organic circuit boards, such as those having a phenolic or epoxy base, is substantially greater than the coefficient of thermal expansion of the metal eyelet so that when the circuit board and eyelet are cooled the decrease in thickness of the board is greater than the longitudinal shortening of the eyelet. After the board is removed from the solder bath the solder between the flanges and the circuitry on the board solidifies to form a rigid solder connection therebetween prior to complete cooling of the board. As the circuit board and eyelet continue to cool and shrink, each circuit path tends to be pulled away from the adjacent eyelet flange due to the greater contraction of the circuit board. The stresses resultant from the differential contraction of the eyelet and circuit board frequently cause a separation or cracking between the eyelet flange and the circuit board. The cracking may occur either in the solder connection between the flange and the circuit board or in the circuit board adjacent the eyelet. Often the entire printed circuit pad surrounding the eyelet hole is lifted to form a crack between the printed circuitry and the board. Fractures may occur in the printed circuitry and result in broken or intermittent electrical connections which are difficult to locate and correct.

During cooling of an eyelet 10 according to the invention following solder dipping, the longitudinal pillar portions 36 which join flange 26 to flange 34 flex or deform slightly to relieve the stress caused by the differential thermal contraction of the board and eyelet. The flexing of the pillars allows the eyelet flange 26 to move with the surface of the circuit board during cooling, thereby preventing cracking of the type described which occurs in conventional structures. Because the difference in contraction of the circuit board and the metal eyelet during cooling is slight, the stress relief pillars 36 need flex or deform only slightly to provide the required stress relief and prevent cracking of the solder connection, circuit board, or circuit path.

In order to avoid cracking at the join between the eyelet flange and printed circuitry the pillars 36 in eyelet 10 must collapse longitudinally to a slight extent in response to a compressive force of smaller magnitude than the tensile force required to cause separation or fractures at the solder connection between the eyelet flange and the circuit board. In conventional circuit board eyelets the cylindrical body portion is rigid and does not permit movement of the flanges with the circuit board during cooling and cracking results.

The stress relief pillars 36 adjacent the flange 26 have a circumferential extent less than the circumferential spacing between adjacent pillars for a longitudinal distance sufficient to permit the slight buckling or deformation required to prevent cracking.

The eyelet 10 provides stress relief to permit movement of the eyelet flanges with the circuit board under thermal shock. In thermal shock tests the circuit board is exposed to extremes in high and low temperatures. In one thermal shock test, soldered eyelets according to the invention were cooled to −65° C. for half an hour, warmed to 25° C. for five minutes, heated to 125° C. for half an hour, and then cooled to 25° C. for five minutes. The thermal shock test was repeated for five cycles. No cracks were found.

Eyelets having stress relief pillars similar to pillars 36 of eyelet 10 permit effective solder joints to be formed between circuitry on double-sided circuit boards even if the solder connection between the eyelet flange and the printed circuitry is not as strong as the solder connection formed when the flanges extend away from the board at 45°. The invention represents a marked improvement over conventional through connectors of the type described in U.S. Patent No. 3,321,570 and in Eftang and Burns, "A New Wiring Board Through Connection," pp. 381–382, Bell Laboratories Report, October 1965.

Notches 28 are provided around the circumference of the upper flange 26 to assure that sufficient solder flows into the upper solder V 58 to make a reliable connection between the eyelet and the printed circuitry on the upper side of the circuit board. The lower solder V 60 is exposed directly to the bath of molten solder so that there is no problem of assuring sufficient solder for making a connection with the printed circuitry on the lower side of the circuit board. The holes 20 and slits 18 which form the notches 28 are located at the middle of the circumferential extent of each finger 30 so as to prevent weakening of the joint 38 between the spring system 26–30 and the body portion 24 of the eyelet. It is important that the notch 28 extend to the top of the body portion 24 to assure capillary flow of solder through the notches and into the solder V. As shown in FIGURE 8, solder dipping completely fills the interior of the eyelet so that a reliable electrical connection is established between the lead wire 48 and each of the printed circuit paths 46 carried by the circuit board 44.

FIGURE 6 illustrates typical uses of the eyelet in circuit board circuitry. The board 50 is provided with a number of printed circuit paths 52 and has a number of eyelet holes formed therein at the ends of the circuit paths in which eyelets 54 as described herein are secured. Circuit elements have been partially attached to the circuit board 50 so that two of the eyelets 54 are shown with lead wires inserted therein and another eyelet 54 is shown with the grounding lug of metal shield 56 inserted therein. When the board 50 is solder dipped, the shield 56 and the leads inserted in the eyelet 54 will be securely attached thereto by reliable solder joints.

It is important to note that an eyelet as described secures a lead wire or lead wires to a circuit board within the thickness of the circuit board. This is important because in modern circuitry there is a minimum of space available between the circuit board and adjacent parts of the circuit.

While I have illustrated and described a preferred embodiment of my invention, it is understood that this is capable of modification, and I therefore do not wish to be limited to the precise details set forth, but desired to avail myself of such changes and alterations as fall within the purview of the following claims.

What I claim as my invention is:

1. A wire grip circuit board eyelet for holding a lead wire in position on a circuit board during a soldering operation comprising a hollow cylindrical body, a first flange located on one end of said body, extending circumferentially around said body and angularly outwardly of the body, means on the other end of said body for forming a second flange, said first flange being funnel-shaped to form a lead-in to guide the lead wire during insertion into the body of the eyelet, a plurality of wire grip fingers cut out from said body and connected to said first flange at the juncture between the latter and said body, said fingers being spaced around the circumference of the body and extending into the body in converging relation with the free ends thereof grouped together at the end of the body adjacent said means, each finger forming an extension of said first flange into said body, said fingers and said first flange comprising parts of a spring system for resiliently holding a lead wire in the body of the eyelet with adjacent fingers joined to circumferentially continuous portions of said first flange and with each such flange portion joined to said body between said adjacent fingers.

2. An eyelet as in claim 1 wherein said first flange extends away from a plane perpendicular to the axis of said body and located at said one end thereof at an angle of approximately 45° and radial notches are formed in said first flange between adjacent flange portions and extend to the juncture with said body to permit molten solder to flow from the interior of the eyelet through the notches and into the space beneath the first flange.

3. An eyelet as in claim 1 wherein said fingers are essentially planar and the intersection of said first flange and one of said fingers with an axial plane is essentially linear.

4. A wire grip circuit board eyelet for holding a lead wire in position on a circuit board during a soldering operation comprising a hollow cylindrical body, a first flange located on one end of said body, extending circumferentially around said body and angularly outwardly of the body, means on the other end of said body for forming a second outwardly extending flange, a plurality of wire grip fingers cut out from said body, said fingers being spaced around the circumference of the body and extending into the body in converging relation with the free ends thereof grouped together at the end of the body adjacent said means, the other ends of said fingers being joined to said eyelet sufficiently adjacent the juncture between said first flange and said body so that said fingers and said first flange comprise parts of a spring system for resiliently holding a lead wire in the body of the eyelet with said first flange connected to said body at each side of each finger.

5. A wire grip circuit board eyelet as in claim 4 wherein said body includes a plurality of stress relief pillars spaced around the circumference thereof and connecting said first flange and said means, said pillars being sufficiently flexible to permit contraction thereof thereby to obviate movement of said first flange relative to the circuit board during cooling following a soldering operation.

6. An eyelet as in claim 5 wherein radial solder flow openings are formed in said first flange to permit molten solder to flow from the interior of the eyelet through the openings and into the space under said first flange.

7. A wiring system for holding a lead wire during a soldering operation comprising a circuit board having an eyelet hole formed through the thickness thereof, an eyelet including a hollow cylindrical body fitted within said hole and extending between the opposing sides of the circuit board, holding means located at each end of said body and extending angularly away from said body to contact the circuit board at the edges of the hole, said holding means cooperating to locate the eyelet in the hole, and a plurality of wire grip fingers cut out from said body and located within the thickness of said circuit board, said fingers extending into said hole and toward one end of said body in converging relation with the free ends thereof positioned closely adjacent each other whereby upon insertion of a lead wire into said eyelet said fingers are forced apart and engage the lead wire to hold the lead wire within the thickness of said circuit board during soldering of the eyelet.

8. A wiring system as in claim 7 wherein the other ends of said fingers join said eyelet sufficiently adjacent one of said holding means so that said fingers and said holding means comprise parts of a spring system for resiliently engaging the lead wire.

9. A wiring system as in claim 7 wherein said body includes a plurality of stress relief pillars spaced around the circumference thereof and connecting the holding means at each end of said body, said pillars being sufficiently flexible to permit contraction thereof thereby to obviate movement of one holding means relative to the circuit board during cooling following a soldering operation.

10. A wiring system as in claim 9 wherein said one holding means extends away from the circuit board at an acute angle to define an annular solder V between said one holding means and the circuit board, and solder flow openings are formed through said one holding means immediately adjacent said body to permit molten solder to flow from the interior of the eyelet through the openings and into the solder V defined by said one holding means.

11. A wiring system as in claim 9 wherein said one holding means extends away from the circuit board at an angle of about 45°.

12. A wire grip circuit board eyelet for holding a lead wire in position on a circuit board during a soldering operation comprising a hollow cylindrical body adapted to be fitted within an eyelet hole extending through a circuit board, a first flange located on one end of said body, extending circumferentially around said body and outwardly of the body to contact the circuit board at one edge of the hole, flange means on the other end of said body for forming a second flange to contact the circuit board at the other edge of the hole, said first flange and flange means cooperable to locate the eyelet in the eyelet hole, at least one lead wire grip finger cut out from said body and extending into the interior of said body at an angle to the axis of said body with the free end thereof positioned adjacent either said flange or said means, the other of said flange or said means being connected to said body at each side of said finger, said finger partially closing the interior of said body, the other end of said finger being joined to said eyelet sufficiently adjacent the juncture between said other of said first flange or said flange means so that said finger and said other of said flange or said means comprise parts of a spring system for resiliently holding a lead wire in the body of the eyelet during a soldering operation.

13. A circuit board eyelet for establishing a solder connection with a circuit path surrounding a circuit board eyelet hole said eyelet being formed of relatively thin sheet metal stock and comprising an elongate hollow body, a flange at one end of said body extending circumferentially around said body and projecting angularly outwardly from the body, flange means located at the other end of said body adapted to project angularly outwardly of the body to cooperate with said flange to locate the eyelet in the eyelet hole, said body comprising a plurality of longitudinally extending and circumferentially spaced pillars, the width of each pillar being sufficiently narrow for a distance along the length of the pillar and the circumferential spacing between adjacent pillars being sufficiently great to permit said body to collapse axially in response to thermal stresses during cooling after solder dipping.

14. An eyelet as in claim 13 wherein the spaces in said body between adjacent pillars are formed by cutting wire grip fingers from said body, said fingers extending into said body in converging relation so as to grip and hold a lead wire inserted into the eyelet during soldering.

15. A circuit board eyelet for establishing a solder connection with circuitry on a circuit board, said eyelet being formed of thin metal stock and comprising a body portion adapted to be fitted within a hole in the circuit board, circumferential flanges located at each end of the body, said flanges extending circumferentially around said body and angularly outwardly therefrom, said body including a plurality of stress relief pillars extending longitudinally between said flanges, and spaced apart from each other a distance sufficient to permit said body to collapse axially in response to thermal stresses during cooling after solder dipping.

16. An eyelet as in claim 15 wherein said flanges are shaped to extend away from the circuit board at an angle of approximately 45° and said one of said flanges is provided with radial notches extending inwardly to said body.

17. An eyelet as in claim 15 wherein said body includes a plurality of wire grip fingers for holding a lead wire in the eyelet during solder dipping.

18. A circuit board eyelet formed from relatively thin sheet metal stock comprising an elongate hollow body rolled from said stock and adapted to be fitted within a circuit board hole, outwardly extending first holding means at one end of said body, means for forming second holding means at the other end of said body, said first holding means and said means adapted to hold the eyelet in a circuit board hole, and a plurality of wire grip fingers cut out of said body and bent into the interior of said body, said fingers being located between said first holding means and said means and extending in the same direction along the longitudinal axis of said body with the free ends thereof grouped together, said fingers and said body defining solder flow paths extending between the ends of said body whereby molten solder flows into said eyelet by capillary action.

19. A circuit board eyelet as in claim 18 wherein said other ends of said fingers are located adjacent said first holding means and said fingers and said first holding means form part of a spring system for holding a lead wire in said eyelet, said first holding means joining said body to each side of each finger.

References Cited

UNITED STATES PATENTS

| | | | |
|---|---|---|---|
| 2,915,678 | 12/1959 | Frazier et al. | 317—101 |
| 3,187,298 | 6/1965 | Shannon | 339—258 |
| 3,212,049 | 10/1965 | Mittler et al. | 339—217 X |
| 3,283,288 | 11/1966 | Biba et al. | 339—275 X |
| 3,368,188 | 2/1968 | Olsson | 339—258 X |

RICHARD E. MOORE, Primary Examiner

U.S. Cl. X.R.

339—220, 258, 275